United States Patent [19]

Kannari

[11] Patent Number: 4,799,008

[45] Date of Patent: Jan. 17, 1989

[54] AC LEVEL CALIBRATION APPARATUS

[75] Inventor: Shigeru Kannari, Gyoda, Japan

[73] Assignee: Advantest Corporation, Gyoda, Japan

[21] Appl. No.: 35,391

[22] Filed: Apr. 7, 1987

[30] Foreign Application Priority Data

Apr. 14, 1986 [JP] Japan .................................. 61-86255

[51] Int. Cl.[4] ...................... G01R 31/28; G01R 35/00
[52] U.S. Cl. .................................... 324/73 R; 324/74;
324/130; 371/27
[58] Field of Search ............... 324/73 R, 130, 74, 132;
371/27; 364/571; 328/162; 323/299, 300

[56] References Cited

U.S. PATENT DOCUMENTS 4,340,856 7/1982 Orlandi .............................. 324/73 R
4,637,020 1/1987 Schinabeck ........................ 324/73 R

FOREIGN PATENT DOCUMENTS 0136206 3/1985 European Pat. Off. .
2739529 3/1978 Fed. Rep. of Germany .
3136813 6/1982 Fed. Rep. of Germany .
2028517A 3/1980 United Kingdom .

OTHER PUBLICATIONS

"Etalonnage d'un calibrateur de haute precision" *Electronique Industrielle*, No. 78, Nov. 1984 pp. 51-56.

Primary Examiner—Ernest F. Karlsen
Attorney, Agent, or Firm—Staas & Halsey

[57] ABSTRACT

In an analog test system for testing integrated circuit chips, AC level calibration is achieved by adding a minimal number of new elements and more fully utilizing elements existing in the system. A reference voltage from an existing precision DC power source is fed to an analog switching device. A control signal is also fed into the analog switching device from an existing digital signal generator. Based on the control signal, the analog switching device converts the reference voltage into a rectangular waveform signal, which is then digitized. The digital signal is analyzed, and data from the digital signal is compared with reference data, and the AC level error, if any, is determined. AC level calibration is based on this error.

5 Claims, 4 Drawing Sheets

AC LEVEL CALIBRATION APPARATUS

BACKGROUND OF THE INVENTION

Today, with new advanced technology many functions, including analog and digital functions, are internalized in an IC chip. For example, a Coder/Decoder Large Scale Integration (CODEC LSI) device integrates an analog input terminal and a digital signal output terminal As a result, it is necessary for an analog test system to internalize analog test functions together with digital test functions to test an analog IC component.

Some previous analog test systems utilize a DC voltage measuring module to level calibrate, but they can only DC level calibrate with a precision power source and they cannot, for example, calibrate sine waves. Even though some previous analog test systems have the ability to perform AC level calibration, it is necessary to utilize both an AC calibrator (i.e., an AC standard voltage generator) and a digital multimeter which can measure AC voltage. However, AC measuring instruments of high accuracy are costly and rather bulky. Also, they are very sensitive to noise and temperature changes, so that they are difficult and expensive to maintain. In addition, the execution time for calibrating the AC level accuracy of an analog test system is quite lengthy.

FIG. 1 is a block diagram of one example of a conventional analog test system 10. A signal generator 12 includes an analog signal generator 13 and a digital signal generator 14, and supplies test signals to a device under test (DUT) 19 in a test station 11. According to this example, a test signal, originally generated digitally at the digital signal generator 14, passes through a D/A converter 15 and a filter 16 in the analog signal generator 13 and is finally supplied in analog form to an analog signal input terminal 17A of the DUT 19. Also, the digital signal generator 14 generates the digital signals "1" and "0", which are supplied to a digital signal input terminal 17B of the DUT 19.

An analog signal output terminal 18A and a digital signal output terminal 18B are connected respectively to an analog signal measuring unit 21 and a digital signal measuring unit 22 in a signal measuring unit 20. The analog signal measuring unit 21 is composed of a waveform digitizer 23 and a digital signal processor 24. The waveform digitizer 23 receives analog signals from the DUT 19, converts them to digital data signals, and finally directs those digital data signals to the digital signal processor 24. This processor provides a suitable digital process, (e.g., Fast Fourier Transform (FFT)) to the digital data signals output by the waveform digitizer 23. Consequently, an analog signal from the DUT 19 is analyzed digitally by the signal measuring unit 20.

The conventional analog test system 10 of FIG. 1 also includes a power source 25 for supplying power to the DUT 19 and a precision power source 26. The precision power source 26 is utilized for a DC level calibration of the power source 25, the analog signal measuring unit 21, and other units in the analog test system 10. However, since AC measuring instruments are expensive and complicated to use, as has been described, the conventional analog test system has disadvantages in AC level calibration.

SUMMARY OF THE INVENTION

An object of this invention is to add a minimum number of components to an analog test system in order to develop highly accurate AC level calibration.

It is another object of this invention to provide a method for AC level calibration in an analog test system.

According to this invention, an analog switching device is provided between the precision power source and the analog signal measuring unit. This analog switching device is controlled by a digital signal generator, and switches on and off the flow of voltage from the precision DC power source to the digitizer during AC level calibration. Thus, rectangular waveform signals are generated for use as AC level calibrating signals. Therefore, AC level calibrating signals are supplied to the digitizer in the analog signal measuring unit.

The output signal from the waveform digitizer is supplied to a digital signal processor, where it is transformed to Fourier spectra. The Fourier transformed value is then compared to a predetermined correct value, and thus the AC level error is obtained. These values are stored in a calibration data file. When a DUT is tested, test data generated therefrom is compensated for the AC level error, that is, the AC level error is added to or subtracted from the values obtained from testing the DUT 19.

These together with other objects and advantages of the invention will become more apparent from the following description, reference being had to the accompanying drawings wherein like reference numerals designate the same or similar part throughout.

DESCRIPTION OF THE PREFERRED EMBODIMENT

Figure 1:
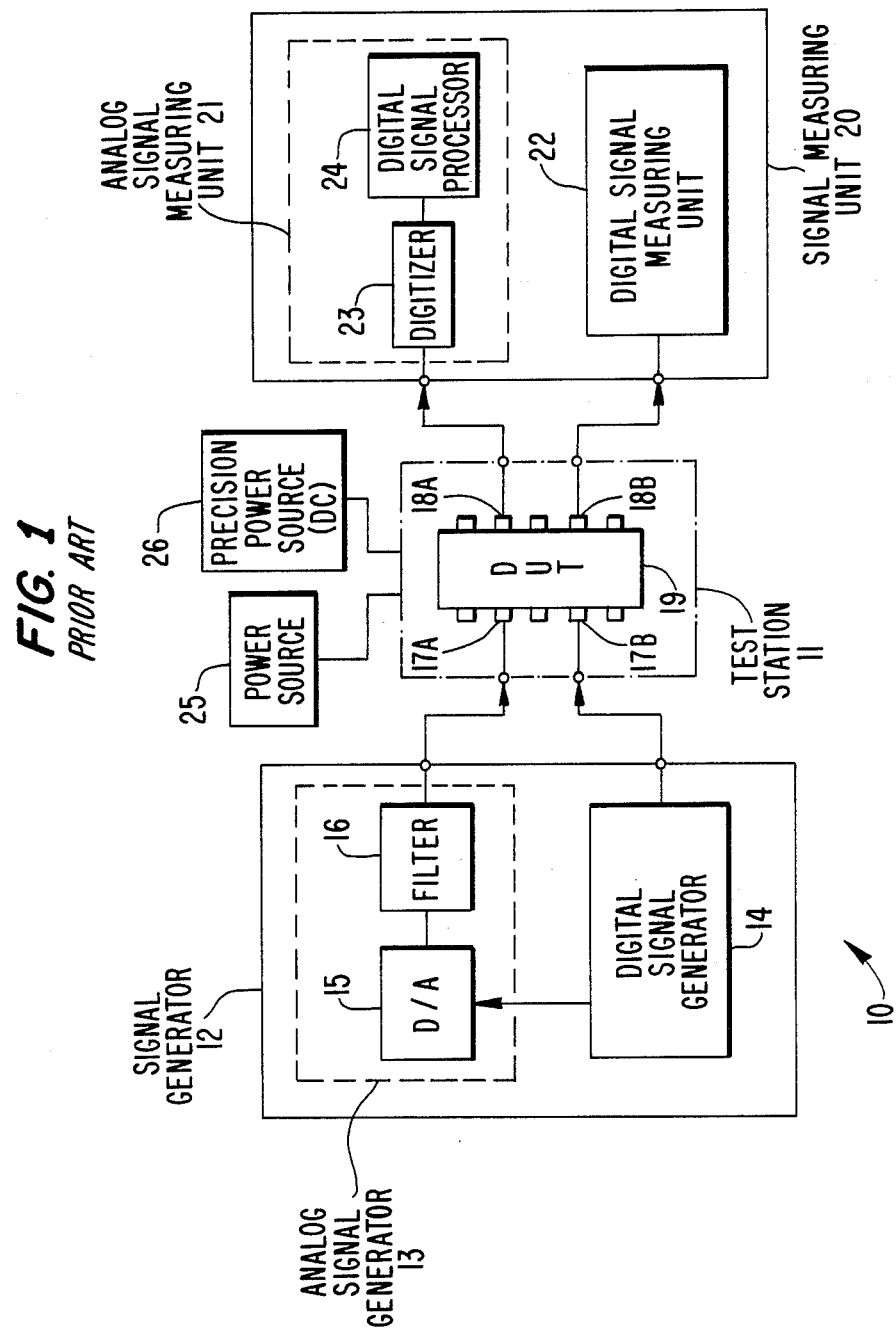
FIG. 1 is a block diagram of a prior art analog test system.
Figure 2:
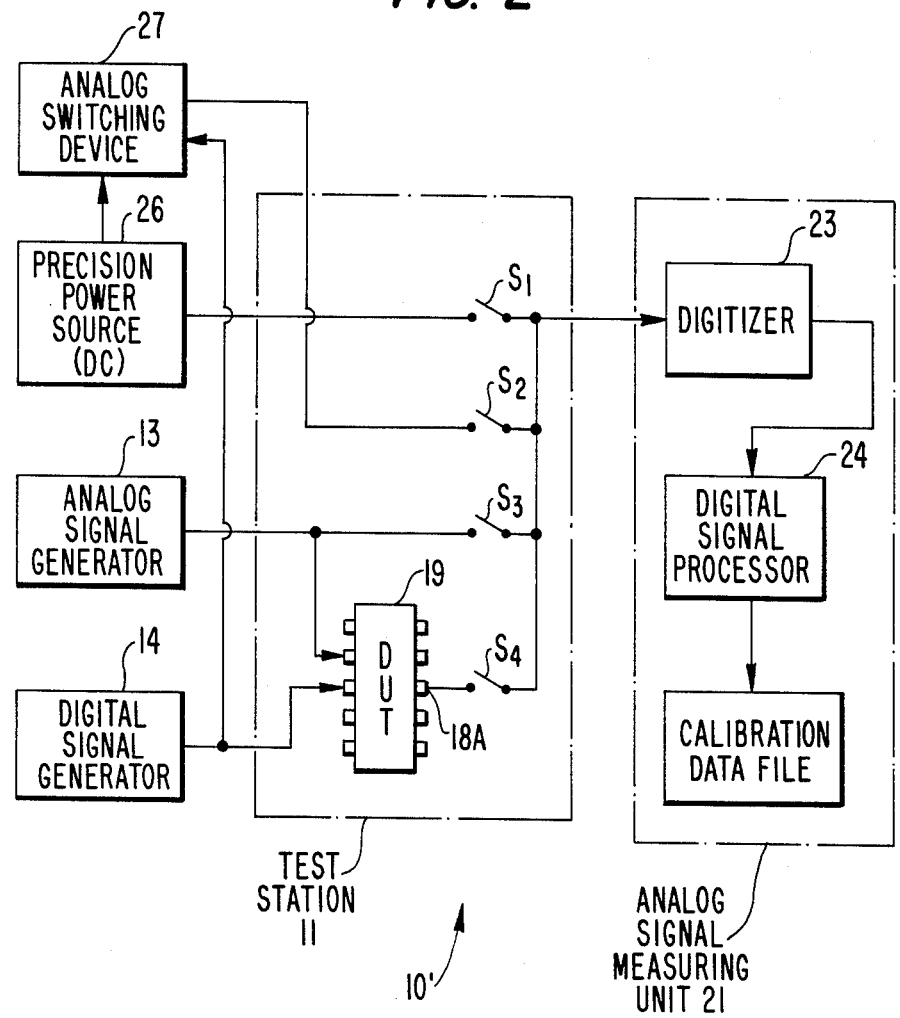
FIG. 2 is a block diagram of an embodiment of the present invention.

FIG. 2 is a block diagram of an embodiment of the present invention. Elements which correspond to elements in FIG. 1 are indicated by the same symbols and their descriptions are omitted. According to the present invention, an analog test system is designed so that it can calibrate both DC and AC levels. An analog switching device 27 is coupled between a precision power source 26 and an analog signal measuring unit 21 as a component of the AC level calibration circuit of the analog test system 10' of the present invention. The analog switching device 27 is controlled by a digital signal generator 14 during AC level calibration, so that an AC level calibration signal is supplied to a waveform digitizer 23 in the analog signal measuring unit 21.

An output from the precision power source 26 is supplied to the digitizer 23 through a DC level calibration switch $S_1$, and is also supplied to the analog switching device 27, from which it passes through an AC level calibration switch $S_2$ to the digitizer 23. Further, an output from an analog signal generator 13 is supplied to the digitizer 23 through a signal generator calibration switch $S_3$. All of these switches ($S_1$-$S_3$), and a test switch $S_4$ between an analog signal output terminal 18A in a DUT 19 and the digitizer 23, are controlled by the signal from the digital signal generator 14.

For testing the DUT 19, all the test switches must be open except the test switch $S_4$, so that the analog signal outputs from the DUT 19 pass directly to the digitizer 23. In contrast, for DC level calibration, all the test switches except the DC calibration switch $S_1$ are open so that DC voltage $V_1$ of the precision power source 26 is supplied to the digitizer 23. In addition, by closing the signal generator calibration switch $S_3$, the signals from the analog signal generator 13 are directed to the digitizer 23, which has completed its DC level calibration. Since the waveform digitizer 23 has finished its calibration, a DC level calibration of the analog signal generator 13 will then be performed.

According to the present invention, an AC level calibration is completed by closing only the AC calibration switch $S_2$ and controlling the analog switching device 27, so that AC level calibration signals are directed to the waveform digitizer 23.

Figure 3:
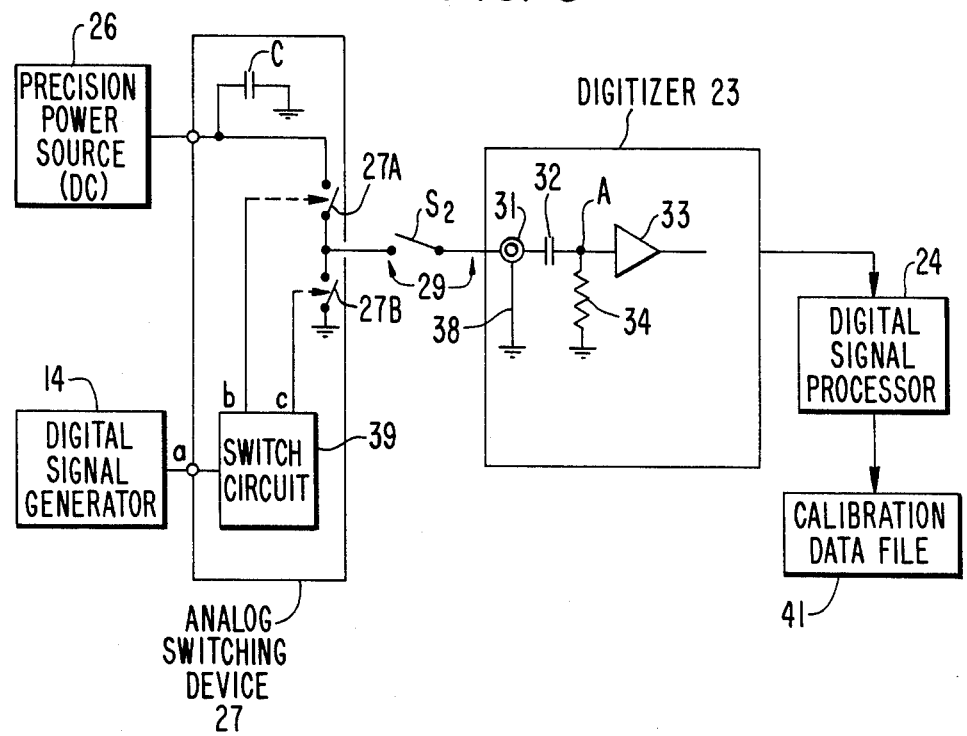
FIG. 3 is also a block diagram showing details of the analog switching device 27 of FIG. 2.

FIG. 3 is a more detailed block diagram of the analog switching device 27 and its connection through the AC level calibration switch $S_2$ to the digitizer 23 of the present invention. A high quality direct current power source is utilized for the precision power source 26, and its output voltage $V_1$ is supplied to an input terminal 31 in the digitizer 23 through a first analog switch 27A and a coaxial cable 29 via the AC level calibration switch $S_2$. The signal supplied to the input terminal 31 then passes through a resistor 34 which is connected to an analog test system's ground. The coaxial cable 29 is also connected to a second analog switch 27B which is controlled inversely from the first analog switch 27A and which is connected to ground. Therefore, with this second analog switch 27B, the input terminal 31 can be connected to ground via the coaxial cable 29. An outer conductor 38 of the coaxial cable 29 is also connected to ground and the input terminal 31.

Figure 4:
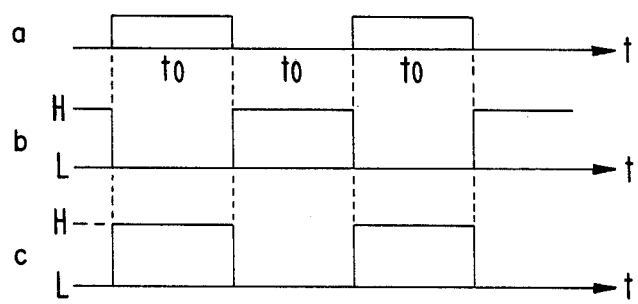
FIG. 4 is a waveform chart explaining the output of the switch circuit 39 of FIG. 3.

Both the first analog switch 27A and the second analog switch 27B are controlled by a control signal from the digital signal generator 14, which alternately outputs signals "0" and "1" during the AC level calibration process. FIG. 4 illustrates a waveform of the control signal. The digital signal generator 4, for example, outputs a signal "1" for a time period $t_o$ and outputs a "0" for the next time period $t_o$. Consequently, this control signal repeatedly outputs "1" then "0" (FIG. 4a). Therefore, the digital signal generator 14 outputs a rectangular wave signal with a duty ratio of 50 percent. This control signal is provided to drive a switch circuit 39, where first and second on/off signals (FIGS. 4b and 4c) are generated. The first and second on/off signals, whose polarities are opposite to each other, are supplied to the first and second switches 27A and 27B, respectively. In this example, first and second analog switches 27A and 27B are open when their respective on/off signals are at H-level, and closed when their respective signals are at L-level; that is, they are controlled oppositely to each other. For example, when first analog switch 27A is closed and second analog switch 27B is open for a time period $t_0$, DC voltage $V_1$ is supplied to the input terminal 31 of the digitizer 23. During the next time period $t_o$, both analog switches are oppositely controlled; the first analog switch 27A is open and the second analog switch 27B is closed, so that a ground potential is supplied to the input terminal 31 of the digitizer 23. Then, DC voltage $V_1$ is supplied during the next time period $t_o$. Therefore in this embodiment, as an AC level calibration signal, a precise rectangular waveform is supplied to the digitizer 23. In FIG. 3, a capacitor C is set to exclude spikes from the first analog switch 27A.

According to the present invention, the output from an A/D converter which forms the digitizer 23 is first Fourier transformed in a digital signal processor 24, using either a Discrete Fourier Transform (DFT), or a Fast Fourier Transform (FFT). Then a fundamental wave level included in the AC level calibration signal measured. Finally, the system is AC calibrated based on this fundamental wave level. The rectangular wave shown in FIG. 5 is Fourier transformed to produce:

$$f(t) = (4V_1/\pi) + (\sin(\omega)t + (\tfrac{1}{3})\sin^3(\omega)t + (1/5)\sin^5(\omega)t + \ldots) \qquad (1)$$

As shown in equation (1), the rectangular waveform is represented by the sum of the fundamental frequency component and the harmonic frequency components. Therefore, if there is no AC level error in the digitizer 23, the amplitude of the fundamental frequency component obtained by signal processor 24 should be $4V_1/\pi$.

Figure 5:
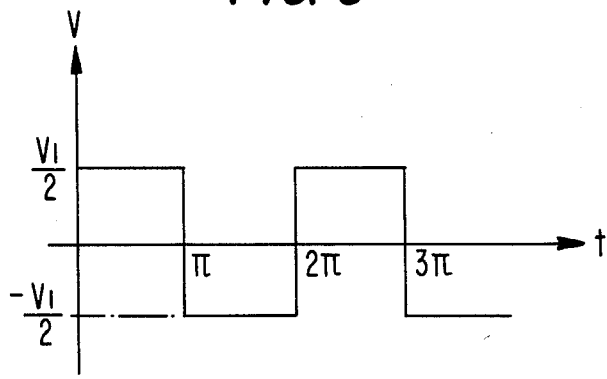
FIG. 5 is a waveform chart of the AC level calibration signal for the waveform digitizer 23 in the analog measuring device 21 at point A.
Figure 6:
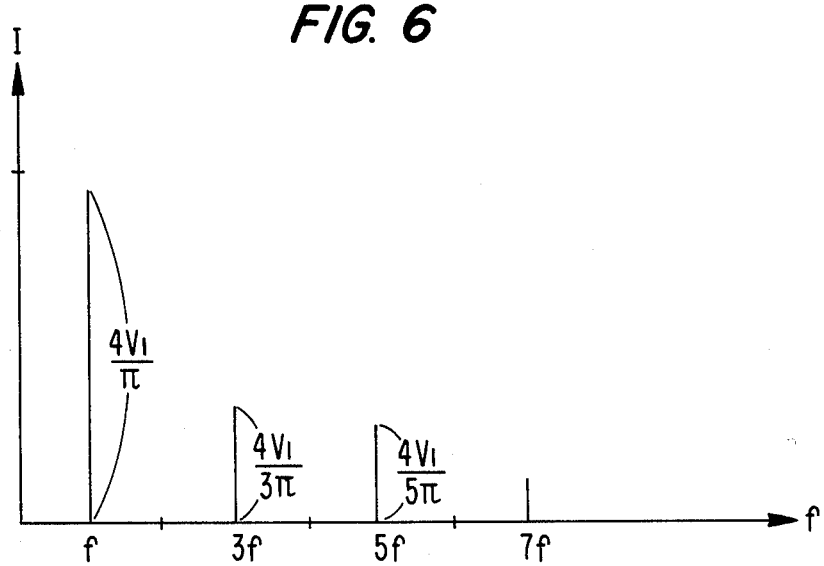
FIG. 6 is a spectral map after Fourier transformation of the AC level calibration signal illustrated in FIG. 5.

FIG. 6 is a spectral map corresponding to the rectangular waveform of FIG. 5 after Fourier transformation. The amplitude of the fundamental component $4V_1/\pi$, in FIG. 6 can be predetermined correctly from the DC voltage $V_1$, and the duty ratio of the rectangular waveform in FIG. 5. Thus, by comparing the predetermined value with the Fourier transformed value, the AC level error is obtained, and the AC level error is stored in a calibration data file 41. This data, together previously collected data for DC level error, is used for calibrating the digitizer 23 by adding or subtracting the appropriate error from the appropriate test data.

In operation, the complete procedure for AC level calibration in the analog test system of the present invention is as follows:

1. The DC offset voltage and DC voltage gain in the digitizer 23 is calibrated while a DC reference voltage from the precision power source 26 is supplied. The calibration data is stored in the calibration data file 41.

2. An AC level calibration signal is generated by switching back and forth between the reference voltage $V_1$ from the precision power source 26 and ground. This signal is provided to the digitizer 23. The output signal from the digitizer 23 is then supplied to the digital signal processor 24, where a Fourier transform is performed on the signal. Finally, the waveform digitizer 23 is AC level calibrated by compensating for the difference between the measured fundamental component level and the calculated fundamental component level. This data is also stored in the calibration data file 41.

3. The signal which tests the DUT 19 is generated by the analog signal generator 13 and is supplied to the digitizer 23 which has completed calibrating steps 1 and 2 above. All the data collected through above steps 1 and 2 are used for calibrating test data, so that test data are compensated for any improper calibration in the analog test system.

According to the above embodiment, DC level calibration and AC level calibration are performed using separate components, namely by passing their calibrating signals through a calibration switch $S_1$ and a calibration switch $S_2$ respectively. However, in an alternate embodiment, instead of controlling a DC level calibration switch $S_1$ for DC level calibration in step 1 above, the first analog switch 27A can be closed so that a voltage $V_1$ from the precision power source 26 is directed to the digitizer 23 before the on/off switching of the first and second analog switches 27A, 27B begins for the AC level calibration.

Also in the above embodiment, a rectangular waveform having a 50 percent duty ratio is used in AC level calibration as a calibration signal. However, the particular duty ratio of 50% and the rectangular signal form are not essential for the calibration, i.e., other duty ratios and waveforms may be employed. In the preferred embodiment, the precision power source 26 is a part of the system itself, but supplying power may be performed by an element outside the analog test system as well. Also the driving circuit 39 which controls the first and second analog switches 27A, 27B can be placed outside the analog test system.

Finally, analog signal measuring unit 21 may be composed of a frequency selection level meter (a band pass filter and RMS meter) as well as composed of the digitizer 23 and the digital processor 24.

A high precision analog switch control signal is easily generated with a precision power source and a digital signal generator driven by an accurate standard clock. This precision power source is an accurate input signal supply for a DC level calibration of an analog test system. Therefore, highly accurate AC level calibration is available by simple modification of conventional analog test systems.

The present invention has been described referring to one main embodiment, however, the present invention permits various modifications within the scope of the subject matter of the present invention. Since numerous modifications and changes will readily occur to those skilled in the art, it is not desired to limit the invention to the exact construction and applications shown and described and accordingly, all suitable modifications and equivalents may be resorted to, falling within the scope of the appended claims and their equivalents.

What is claimed is:

1. An analog test system, comprising:
   a DC power source for generating a DC reference voltage;
   a digital signal generator for generating an alternating control signal which is a first level signal for a first time period, and a second level signal for a second time period;
   an analog switching device, coupled to an output of said DC power source and an output of said digital signal generator, for interrupting the flow of the reference voltage based on the alternating control signal generated by said digital signal generator and for changing the reference voltage into an AC level calibration signal waveform;
   a waveform digitizer, coupled to said analog switching device, for converting the AC level calibration signal into a digital data signal;
   digital signal processing means, coupled to said waveform digitizer, for obtaining reference values from the digital data signal;
   comparing means for comparing said reference values from the digital data signal with predetermined reference values and for obtaining an AC level error; and
   compensating means for calibrating for said AC level error.

2. An analog test system according to claim 1, wherein said analog switching device further comprises:
   a first analog switch coupled between said DC power source and said waveform digitizer;
   a second analog switch coupled between ground and said waveform digitizer; and
   a switch circuit connected to said digital signal generator for controlling said first and second switches based on the alternating control signal from said digital signal generator, wherein upon receiving the first level signal, said switch circuit closes said first analog switch, connecting said power source to said waveform digitizer and allowing the reference voltage to flow to said digitizer, and wherein upon receiving the second level signal, said switch circuit opens said first analog switch and closes said second analog switch, connecting said waveform digitizer to ground.

3. An analog test system according to claim 2, wherein said drive switch circuit further comprises a capacitor coupled between said power source and said first analog switch, for excluding spikes from said first analog switch.

4. An analog test system according to claim 1, wherein said digital signal processing means comprises means for performing a fast Fourier transform on the digital data signal.

5. An analog test system according to claim 1, wherein said digital signal processing means comprises means for performing a discrete Fourier transform on the digital data signal.

* * * * *